United States Patent [19]
Jacobowitz et al.

[11] Patent Number: 5,684,782
[45] Date of Patent: Nov. 4, 1997

[54] USE OF A LASER LIGHT SOURCE AS A DETECTOR VIA A DITHERING MODULATION

[75] Inventors: Lawrence Jacobowitz, Wappingers Falls; Casimer Maurice DeCusatis, Poughkeepsie, both of N.Y.

[73] Assignee: International Business Machines Corporation, Armonk, N.Y.

[21] Appl. No.: 626,302

[22] Filed: Apr. 1, 1996

[51] Int. Cl.$^6$ ............................................. G11B 7/00
[52] U.S. Cl. ............................................. 369/120; 369/100
[58] Field of Search .................................. 369/100, 116, 369/124, 54, 120, 112, 47, 50, 44.32, 126, 128, 129

[56] References Cited

U.S. PATENT DOCUMENTS

| | | |
|---|---|---|
| 3,848,095 | 11/1974 | Wohlmut et al. . |
| 3,946,367 | 3/1976 | Wohlmut et al. . |
| 4,358,774 | 11/1982 | Wilkinson . |
| 4,972,397 | 11/1990 | Zurbrick et al. . |
| 5,070,496 | 12/1991 | Ogawa et al. ............... 369/116 |
| 5,251,198 | 10/1993 | Strickler . |
| 5,386,409 | 1/1995 | Yokota et al. ............... 369/116 |
| 5,506,826 | 4/1996 | Kobayashi ............... 369/116 X |
| 5,511,059 | 4/1996 | Brazas, Jr. ............... 369/116 X |

*Primary Examiner*—David C. Nelms
*Assistant Examiner*—P. W. Huber
*Attorney, Agent, or Firm*—Lawrence D. Cutter

[57] ABSTRACT

Laser light is focused in an accurate manner on selected layers in a multilayer optical disk recording system by means of an analysis of output electrical signals from a dithered source which results in the production of an electrical signal which is proportional to an amount by which the parts of the system are to be relatively moved in order to achieve the desired focus on one of the layers.

5 Claims, 5 Drawing Sheets

USE OF A LASER LIGHT SOURCE AS A DETECTOR VIA A DITHERING MODULATION

BACKGROUND OF THE INVENTION

The present invention is generally directed to a system for focusing laser light on a selected layer in a multilayer optical disk information storage system. More particularly, the present invention is directed to a system for providing an electrical signal which is proportional to an amount by which a laser light source is to be moved relative to a rotating optical disk in order to achieve focus. Even more particularly, the present invention is directed to a system in which a lens or light source is electromechanically dithered to produce an electrical signal which is distinctive in terms of its ability to provide an indication of the optical layer which is being read or written to. Most importantly and most relevantly to the present invention, it is directed to the utilization of a semiconductor laser as both a light source and a detector.

Use of optical disks for information storage has become quite popular. These disks are capable of storing digital data and are generally referred to as CD ROMS. These devices have been shown to be capable of storing many hundreds of megabytes of information.

Even more recently, it has been shown that it is possible to write and read information to multiple layers using optical disk storage technology. These new optical disks can store distinct information on each additional layer. This multilayer approach to optical storage significantly increases the storage capacity of each disk. However, new high-density drives are required to utilize these disks.

These new drives contain a laser and a lens mounted on a servo motor-controlled mechanism. By moving the lens toward and away from the optical disk, laser light is focused on different layers in the disk. However, the more layers that are employed in the disk for data storage, the more difficult it is to provide proper laser focusing. More particularly, as a result of the focusing difficulty, these disks typically require "buffers" of 100 microns or more in thickness between each of the data layers.

Accordingly, there is a need to be able to accurately focus laser light onto the optical disk and concomitantly to be able to read reflected light from that particular layer. It is, therefore, seen that it would be highly desirable to be able to employ an alignment technique using the servo motor and feedback loop which are already present in such drives. Furthermore, it is generally desirable to be able to improve tracking even for single layer optical disks in order to make them more tolerant to shock and vibration for use in portable or mobile applications. It is also very desirable to be able to provide a solution to these problems via a simple modification of disk drives which are already in use so as to improve their tracking accuracy. These needs are particularly well met by a system in which the source of laser light also acts as the detector for reflected light.

SUMMARY OF THE INVENTION

In accordance with one embodiment of the present invention, an optical information storage system comprises a rotatable optical disk which contains stored information. A source of laser light is provided so as to produce modulated reflections from the rotatable disk. A lens system means or mechanism is provided for focusing the laser light in the vicinity of the optical disk. A dithering means or mechanism is provided which causes oscillation of the source of laser light and/or the lens toward and away from the rotatable disk. This causes a modulation in the detected signal which can be used to significant advantage. Furthermore, the system employs the laser light source as a self-contained source and detector which receives light after it has been reflected from the disk; the light source/detector converts the light to an electrical signal. Furthermore, and for particular relevance with respect to the present invention, there is a means or mechanism provided for analyzing the electrical signal from the light detector and for producing therefrom an electrical signal which is proportional to an amount by which the light source should be moved relative to the disk in order to achieve desired focus. In an alternate embodiment of the present invention, instead of moving the light source, it is also possible to change the focus of the lens to achieve the same objective. In another embodiment of the present invention, the means for analyzing the electrical signal from the light detector may be employed simply to indicate which plane the laser light is focused on in the multilayer CD-ROM disk.

The inventors herein have discerned that the signal detection process may be based upon a heretofore undescribed physical phenomenon that occurs in certain solid state laser devices. In particular, the present applicants have discerned that the current in a laser diode varies in intensity when its own modulated light is reflected back into it. In particular, the present applicants have discerned that it is possible to employ the same laser diode as both the source and the detector for a CD-ROM drive circuit. In particular, the present applicants have discerned that this phenomenon permits the circuit to be constructed without a separate photo detector. Accordingly, this results in lighter weight, easier to move, and easier to focus laser light/detector mechanisms. Furthermore, the result is that increasing optical storage densities are possible.

It is further noted that a significant aspect of the present invention is the utilization of specific output waveforms which may be employed to discern the positioning of the laser source. In-particular, through the simple expediency of a thresholding circuit coupled with two counters, it is possible, through appropriate computer logic, to provide an electrical signal which indicates the focus plane. Furthermore, as a natural consequence of being able to know where the focal plane is located, it is concomitantly easier to, therefore, control where one wants it to be.

Accordingly, it is an object of the present invention to provide a mechanism for reading and writing information stored on multilayered optical disks.

It is, furthermore, an object of the present invention to provide a digital electrical signal and circuit which more accurately and precisely aligns laser reading and writing mechanisms in optical disk memory systems.

It is yet another object of the present invention to more easily control focus and alignment in CD-ROM systems.

It is also an object of the present invention to increase the storage capacity of optical information disks.

It is still another object of the present invention to enhance the utilization of multilayer optical disk and the performance of multilayer optical disk systems.

It is also an object of the present invention to make the laser writing and reading mechanisms lighter in weight.

It is also an object of the present invention to increase the storage, speed, and capacity of optical disk drives.

It is a still further object of the invention to employ Z-direction focusing principles to also provide accurate track following in the X and Y directions.

It is yet another object of the present invention to provide a simple digital circuit for determining focal positioning.

Lastly, but not limited hereto, it is an object of the present system to provide a mechanism which is capable of acting both as a laser light source and as a reflected laser light detection mechanism.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
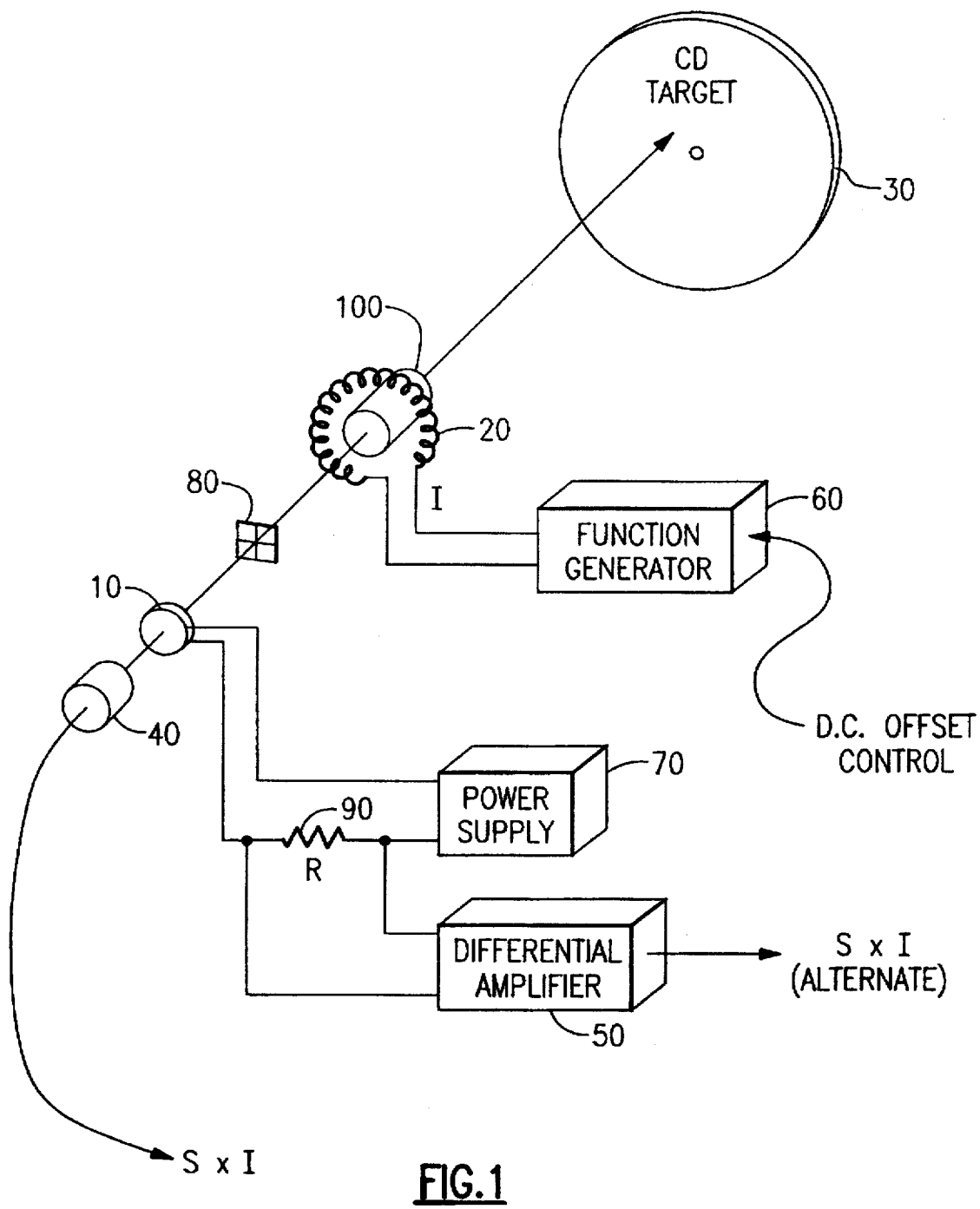
FIG. 1 is a partially schematic block diagram illustrating the system of the present invention.

Instead of attempting to maintain focus by stepping the lens from one position to another, rather, in accordance with the present invention, the lens is moved back and forth or is "dithered" about a central position. The dither frequency may be as low as a few hundred hertz so as not to affect other aspects of the disk drive operation. The dithered light is reflected from the optical disk and sampled with a photodetector. Alternatively, the laser or LED itself may be used as a photodetector in accordance with other aspects of the present invention discussed in greater detail below.

When the optical disk surface to be read is in focus, the reflected light signal frequency is doubled with respect to the dither frequency. Doubling is more particularly illustrated in FIGS. 3 and 4 discussed in detail below. This frequency doubling can be detected with a thresholding circuit which converts the frequency doubling into a digital signal. When the lens moves to focus on a different layer of the optical disk, the reflected light signal is only partially frequency doubled. It is possible to determine accurately when the light is focused on several different planes in the disk using this method. Spacing between successive planes on the disk is equal to one fourth of dither signal. For example, if a 2.5 kHz dithering is used, it is possible to distinguish between focusing on two planes which are 100 microns apart. A slightly higher dithering frequency of 5 kHz enables one to resolve two planes which are only 50 microns apart. In this way, one can focus light on more planes which are spaced more closely together. The invention is limited only by the practical dither frequency of the lens. Nominal position of the lens (center point of the dithering) is actively controlled by a feedback loop from a detector circuit. In this way, the desired plane of the disk is always held in focus. By maintaining more accurate focus on the disk, the present approach allows the use of more layers on a single disk and can increase the storage density by a factor of 3 or 4 or more. As an alternative, the present invention may be used to detect with high accuracy whether or not a single layer disk is in focus.

Accordingly, the method of the present invention is also applicable to the manufacture and utilization of single layer disk drives which are, therefore, more robust and resistant to shock and vibration such as might be encountered in mobile and/or portable computer environments. Furthermore, the implementation of the present invention is exceedingly practical in that existing optical disk drives already contain the necessary servo motor and lens positioning system which are available for implementing the present invention. It is further noted that the present invention is applicable to the reading and writing of optical disk drives which store computer data, audio information, and/or video information. Furthermore, it is noted that the dithering provided by the present invention may also be produced by a mechanical oscillatory distortion of the lens itself rather than employing a mechanical apparatus to simply move the lens backwards and forward. However, this is not the preferred embodiment of the present invention.

For a more complete understanding of the present invention, attention is directed to FIG. 1 wherein there is shown, in schematic diagram form, an arrangement which may be employed to illustrate the operation of the present invention. In particular, in FIG. 1, there is shown diode injection laser 10 which directs laser light through preferred crossed fiber 80 which corrects for unequal divergence of the laser light into lens 100. Crossed fiber 80 serves to circularize the laser light so that the divergence in both directions is equal. The physical positioning of lens 100 is controlled by means of voice coil 20 which is provided with an appropriate dithering signal from function generator 60. This signal also includes an appropriate DC offset control level. Light from lens 100 is directed onto optical disk or CD target 30 from which it is reflected back through lens 100 and diode injection laser 10 to photodetector 40. The electrical signal from photodetector 40 may be employed directly. Alternatively, it has been observed by the present inventors that the drive current passing through diode injection laser 10 is, in fact, modulated by the light returning from the target. Accordingly, by providing a resistor R (reference numeral 90) in the current path of power supply 70, it is possible to extract this same signal as a voltage drop across resistor R by connecting its opposite ends to differential amplifier 50 which provides an alternate output signal. By integrating this signal over an appropriate time period τ (measured in milliseconds), it is possible to produce an output signal, also referred to herein as R (not to be confused with Resistor 90 having resistance value R), which is proportional to the amount by which the lens should be repositioned in order to achieve optimal focus for a particular layer.

Figure 3:
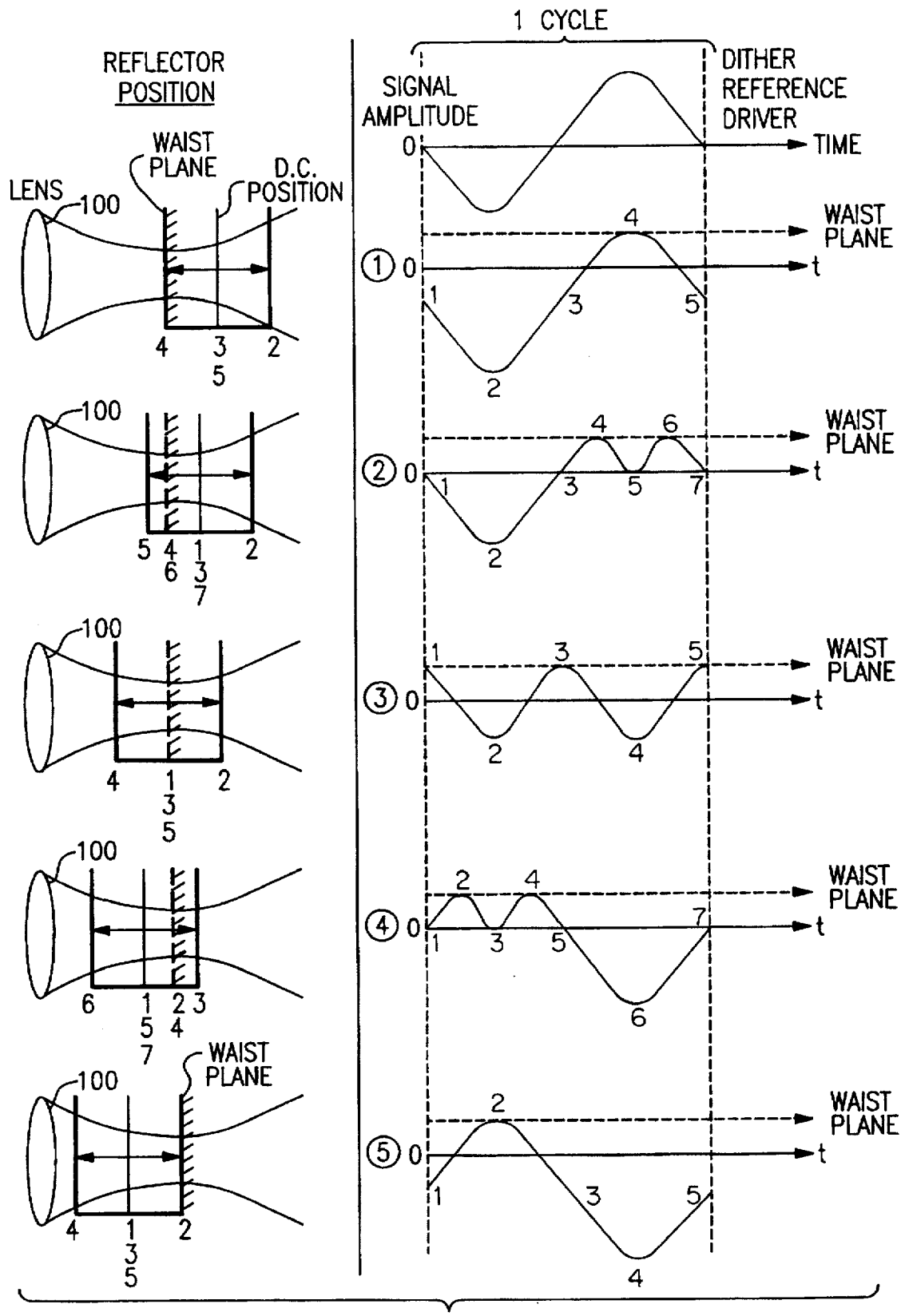
FIG. 3 is an illustration of the various signal waveforms produced in accordance with the present invention as a function of the DC position of the focal plane with respect to the waist plane of the lens.
Figure 4B:
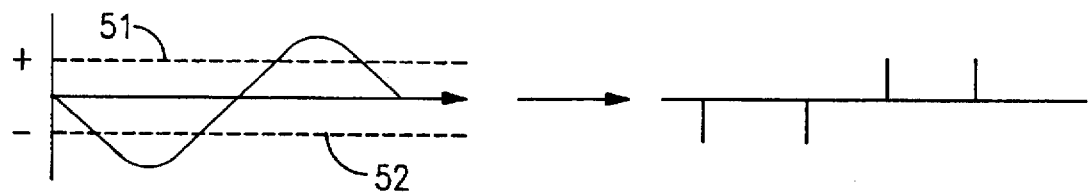
FIGS. 4B–4F are illustrations of the signal waveforms illustrated in FIG. 3 subsequent to their processing through a threshold detection circuit.
Figure 4C:
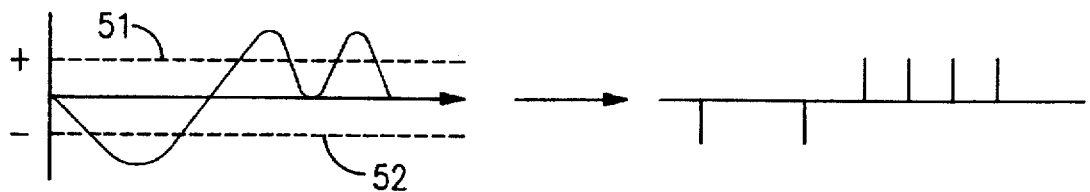
Figure 4D:
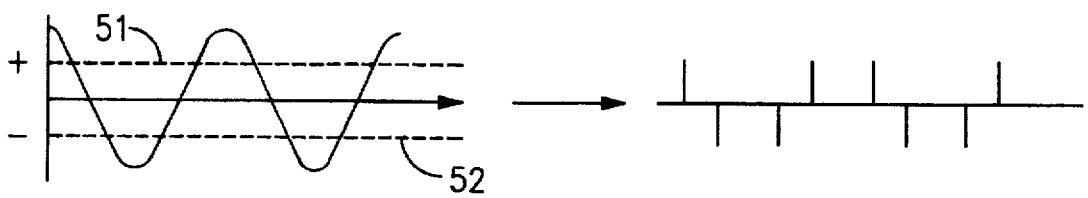
Figure 4E:
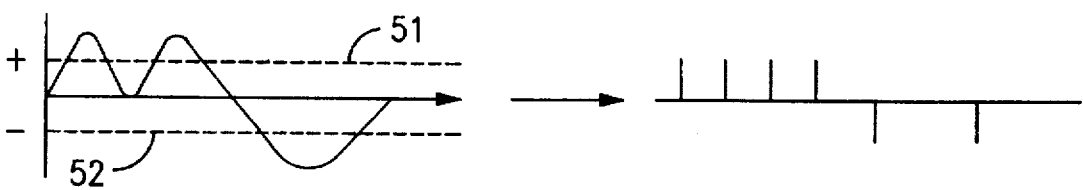
Figure 4F:
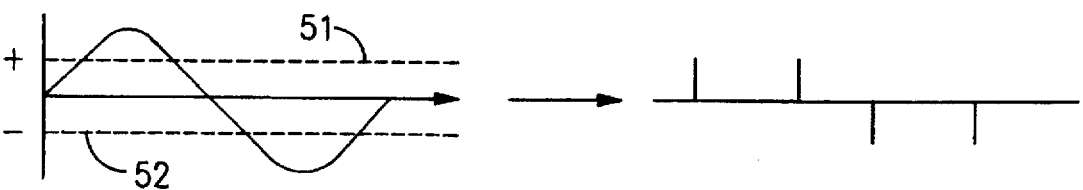

As is more particularly illustrated in FIG. 3, at points of optimal focus, the frequency of the dither modulated output signal is doubled. This phenomenon is more particularly described below with reference to the discussions of FIG. 3.

Figure 2:
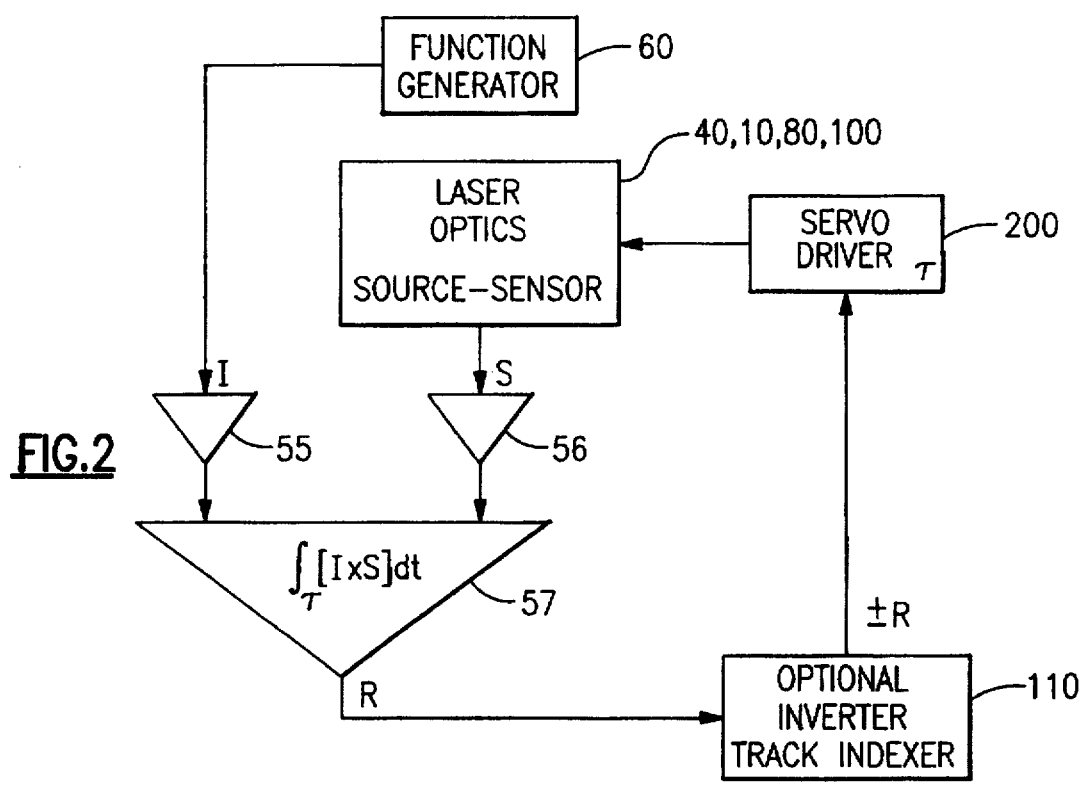
FIG. 2 is a functional block diagram illustrating a signal processing mechanism for producing a signal which is proportional to-the distance needed to provide proper focus.

FIG. 2 illustrates, in functional block diagram form, an apparatus which was employed to test the principles of the present invention. In particular, function generator 60 provided a dithering signal $I=I_0 \sin \Omega_D t$. At the same time, the laser optics setup which included photodetector 40, diode injection laser 10, beam collimating crossed fiber 80, and lens 100 resulted in a production of a signal S. The dithering signal I and the return signal S are preferably passed through amplifiers 55 and 56 respectively. The signal S can be represented as a Fourier series with a DC component $a_0$ plus other sinusoidal and cosinusoidal components in accordance with the follow equation:

$$S = a_0 + \sum_{n \text{ odd}} a_n \sin(n\omega_D t) + \sum_{n \text{ even}} b_n \cos(n\omega_D t)$$

The output from detector 40 or the voltage across resistor 90 is proportional to the vector cross product of the signals I and S. If this product is integrated over the period of the dithering signal, namely, $\tau$, the result that follows is shown below in equation 2.

$$R \propto \int_o^\tau (I_o \sin\omega_D t)(a_o + a_1 \sin\omega_D t + a_2 \sin 2\omega_D t + \ldots) dt$$

Because of the orthogonality relationships expressed in the equation below:

$$\int_o^\tau \sin(m\theta)\sin(n\theta)d\theta = 0 \text{ if } m \neq n$$

it is seen that the resultant output R is proportional to the magnitude of coefficient $a_1$. This magnitude represents the distance from the focal plane to the desired position. Accordingly, it seems to be a unique feature of the present invention that there is provided a signal which is proportional to the amount by which the positioning is in error. This is an important property because it provides a feedback control mechanism for precisely aligning the lens.

It is further seen that the resulting output is either positive or negative depending on the direction in which the lens is out of focus. The signal R, therefore, allows the determination of three conditions: (1) whether or not the system is out of focus; (2) the direction in which the lens must be moved to achieve focus; and (3) the amount by which the lens should be moved to restore focus.

The preceding equations further prove that it is always possible to determine these properties for any amount of defocusing which occurs. This is a feature which is unique to the present invention especially in comparison with other systems which require that the lens be out of focus by a (possibly hefty) predetermined minimal amount. Such a limitation severely curtails fine control of lens focus. In the present invention, however, minimal correction limits are not an inherent limitation.

More particularly, it is seen in FIG. 2 that the signal R may be fed back through optional inverter 110 to servo driver 200 which responds within the period $\tau$ to correctly position the lens for proper focus. It is seen that this feedback mechanism employs the variable that is of greatest value in correcting the error. It is in this way that precise and rapid alignment may be accomplished.

The principles upon which the present invention operates may be more particularly illustrated in FIG. 3 which shows a 5-layer optical disk example. In particular, the lines extending axially outward from lens 100 represents the cone of focus for that lens. In particular, for any given lens configuration, the code of focus possesses a point at which it is narrowest. This point defines the waist plane for the lens. For a specific lens shape, this plane is constant. It should also be particularly noted with respect to this figure and others that the relevant feature is the relative distance between the lens and the disk. FIG. 3 has been constructed from the point of view of the lens. The solid vertical line in the center represents DC position of the lens when the dithering voltage applied is 0. This DC position can nominally be thought of as the location of a layer within the disk to be read. The numbers shown in the left-hand portion of the figure correspond to the signal time points shown in the right-hand portion of the figure. The operation of the dithering aspects are now particularly described.

In particular, it is seen in situation 1 in FIG. 3 that the DC position is at its farthest right-hand travel. As the lens is dithered further to the right, the signal level drops from the level at position 1 to its lowest point at position 2. As the dithered lens returns to the nominal DC position, the signal value returns to that which is shown at point 3 in the diagram. As the lens position due to dithering moves further towards the right, that is, closer to the waist plane of the lens, the signal increases to its highest positive output level at position 4. Again, thereafter, the signal level declines as the lens returns to its DC position. Thus, as the lens is dithered over one cycle of duration $\tau$, the signal levels vary to levels shown at positions 1, 2, 3, 4, and 5 in the left-hand and right-hand portions of situation 1 ("1" as shown in the circle in the figure) shown in FIG. 3.

As the DC position is moved further towards the left, it is seen that a different output signal is produced. This signal is shown in situation 2 in FIG. 3. The first half of the cycle is almost identical to that which is shown in situation 1. However, the depth of the curve is not as severe as it is in situation 1. Nonetheless, and more significantly, after the dithered position passes through the 0 bias position number 3, the dithered lens produces a signal which has twin peaks 4 and 6 as the maximal extent passes twice through the waist plane. The resultant output signal, therefore, illustrates a form of frequency doubling in the latter half of the period $\tau$. The resultant output signal is shown as situation 2 in FIG. 3.

It is to be particularly noted that in situation 3 in FIG. 3, the output waveform exhibits what is effectively a frequency doubling of the dithering driver signal. This occurs because the DC position is identical to the waist plane. This illustrates the situation in which the focus on a plane is optimal.

This doubling of the dithering frequency is a phenomenon reported in U.S. Pat. No. 4,385,774, issued Nov. 9, 1982, to Richard L. Wilkinson. However, the teachings of Wilkinson do not provide a mechanism for extracting the value R which is indicative of the amount by which the lens is to be moved to achieve the desired focus. Without this variable, feedback control of the alignment mechanism is difficult to achieve.

With respect to the other situations shown in FIG. 3, situations 4 and 5 are somewhat symmetric but mirror images of situations 2 and 1 respectively. In each case the output signal waveform is shown.

The present inventors have further recognized that the resultant output waveforms may be processed in a digital fashion. In particular, the waveforms shown in situations 1 through 5, in FIG. 3, may be passed through a threshold detector. If this process is carried out, the resultant signal waveforms and the form of individual spikes or pulses are shown in FIG. 4, parts B through F respectively. In particular, referring to part B of FIG. 4, it is seen that situation 1 results in two pulses below the 0 voltage reference line followed by two voltage pulses above the reference line as shown. These pulses result when the output signal form rises above reference levels 51 or 52 as shown in the left-hand portion of FIG. 4. In a similar way, a sequence of pulses or spikes may be produced as a result of the other situations. These are shown in portions C, D, E, and F of FIG. 4.

Figure 5:
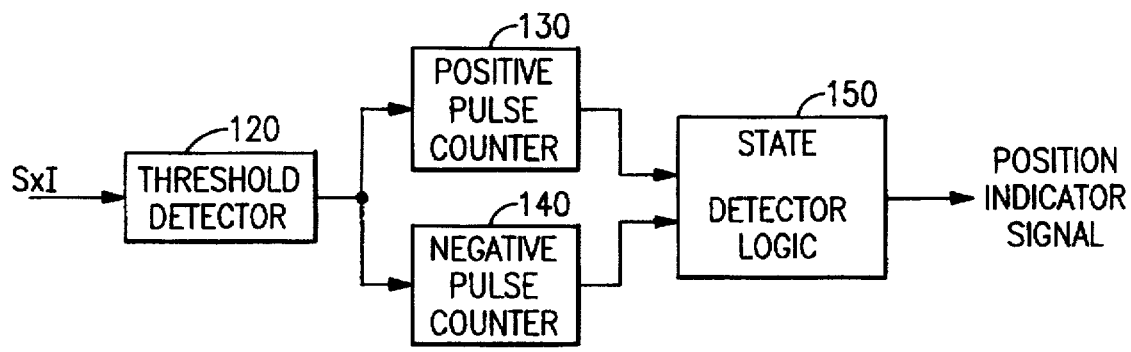
FIG. 5 is an illustration of one embodiment of a digital circuit which may be employed to determine the position of the focal plane.
Figure 6:
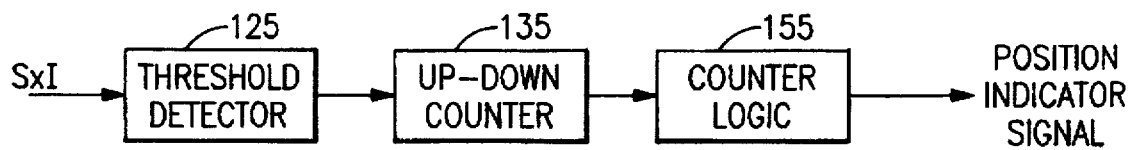
FIG. 6 is an illustration of an alternate embodiment of a digital circuit which may be employed to determine the position of the focal plane.

Furthermore, the present inventors have realized that these signals may be passed through a positive pulse counter and a negative pulse counter to provide a very rapid indication of where the DC position of the lens is with respect to the desired surface to be focused upon. A circuit for carrying out this digital processing operation is shown in FIG. 5. An alternative is shown in FIG. 6. With specific reference to FIG. 5, the signals from the apparatus shown in FIG. 1 are passed through threshold detector 120 resulting in a series of spiked pulses as shown in the right-hand portion of FIG. 4. A positive pulse counter 130 is provided to count pulses that are positive in voltage. Likewise, negative pulse counter 140 counts the negative pulses. The output from these counters are provided to state detector logic 150 which can provide an almost immediate indication of the relative versus desired position of the DC lens position.

In particular, if the positive pulse counter 130 has a value 1, this means that situations D, E, and F in FIG. 4 are possibilities. If the next pulse is a positive pulse, situations E and F are possibilities. If three positive pulses in a row occur, then it is clear that the situation illustrated in part E of FIG. 4 pertains. This corresponds to situation 4 in FIG. 3. It is, thus, then known that it would be desirable to move the DC value of the dithering offset so as to move the lens to the right. It is to be particularly noted that not all of the pulses need to be generated before it is determined what has to be done to change the DC offset value. This is very desirable in that it speeds the correction operation. One does not even have to wait for a whole dithering period τ to begin producing the desired positioning via the feedback servo loop. Alternatively, an up-down counter 135 may supply its output signals to counter logic 155 which operates in a similar fashion to provide an indication of the lens position versus its desired position.

In the process of developing the improved focusing system disclosed herein, the present applicants have also discovered and utilized an entirely new phenomenon with respect to the operation of certain laser devices. In particular, semiconductor diode lasers, such as those fabricated either from solid state materials including aluminum gallium arsenide, may be made to function as light detectors when modulated laser light is reflected back into the laser cavity. Modulation of the light reflected back into the cavity appears as a corresponding modulation of the laser drive current. If the signal being detected is at a different frequency than the laser drive signal, such that the two can be separated with a frequency selective filter, then the detected signal can be obtained from a resistor placed in series so as to conduct the drive current (as discussed above and shown in FIG. 1). Any other convenient means for detecting variation in current may also be employed.

In particular, reference to the focusing application discussed herein, the dither signal is at a much lower frequency than the laser data rate and, as a result, it is thus very easily separable using conventional signal filtering devices and methods. However, the use of this phenomenon is not restricted to CD-ROM-type applications. For example, it may be employed in barcode scanners or in fiber optic sensor systems which employ laser light reflected from a target.

The use of the above-described semiconductor laser devices as both laser light source and as signal detector offers many advantages to the industry. For example, this aspect of the invention clearly eliminates the need for an extra, separate photodetector. This alone is a decided cost, packaging and manufacturing advantage. However, it is only one of many related advantages. Additionally, this design simplifies the focusing optics and alignment since the light to be detected is simply reflected back along the same path into the source from which it came. By virtue of this simplified optical geometry, the apparatus is more tolerant of shock, vibration and other sources of misalignment. Optical or light amplitude techniques suffer from aberrations in the optics and from light source fluctuations. The present invention, however, employs a frequency method which is essentially free of these amplitude problems. It is, therefore, seen that a direct consequence of the utilization of frequency effects is that the overall system is much more immune to noise effects (such as, for example, light intensity fluctuations caused by variations in the laser drive current). This does not, however, preclude amplitude-based methods from being used in conjunction with the present invention.

Furthermore, since the photodetector has been eliminated and since the optical tolerances have been improved, the reading head may be made lighter (less mass and weight). This means that the reading head may be moved faster. This alone increases data access times and, therefore, data retrieval times. Moreover, by simplifying the focusing optics, the reading head may be placed closer to the CD-ROM disk. This makes it possible to manufacture more compact drive units, a characteristic which is especially important for portable applications.

Lastly, but very importantly, by being able to move the reading head closer to the disk and achieving better focus of the light, one can place the tracks closer together and can thus increase the storage density, even in single-sided, single-layer CD devices.

From the above, it should be realized that the present invention makes it eminently more practical to control the focusing of laser light onto various planes within a solid body. Thus, while the primary application of the positioning system of the present invention is directed to multilayer CD-ROM reading devices, it should also be appreciated that the devices and methods disclosed are applicable to reading three-dimensional holographic information. Thus, the present invention is also a control mechanism for accurately selecting a planar region in a solid body used as a holographic storage medium for interaction between the laser light and the chemical, crystalline, structural or other properties of the solid body which are present in the selected plane.

Yet another utilization of the principles of the present invention can be found in a system for improved CD-ROM track following in the X-Y plane, as opposed to Z-direction position control as described above. In this case, dithering is preferably applied in the radial direction relative to the curved tracks on a CD-ROM disk. Since the between-track area is more reflective than the pitted written section, advantage may be taken of the nature of the returned signal to indicate the position of the focused laser spot relative to the track to be followed. As above, this greater degree of control allows a closer spacing of the tracks and thus provides an increase in areal data density. However, because there are portions of the tracks that may not be written, or written with various pitted data patterns, it is preferable to average the output level over a longer period of time. Thus, for example, while the integration process described above is performed over a period τ, the process for X-Y direction control may employ integration over a period of 4τ, for example.

Figure 7A:
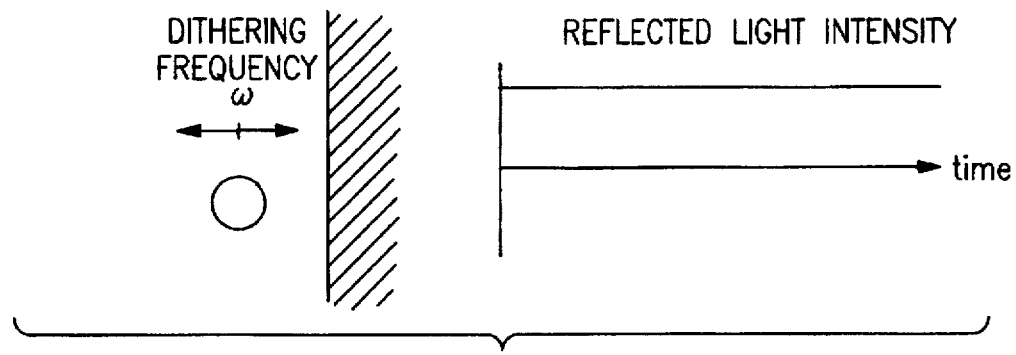
FIGS. 7A–7D are illustrations of the various signals produced by reflected and detected (laser) light when dithering is employed to track along a boundary in the X-Y plane between areas of differing reflectivity.
Figure 7B:
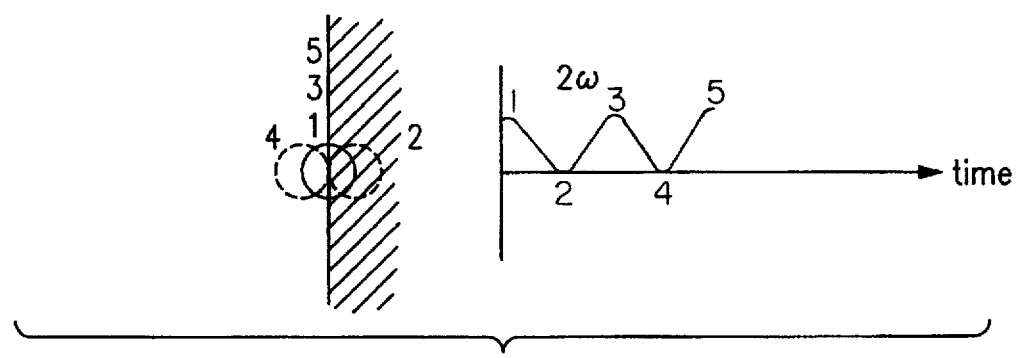
Figure 7C:
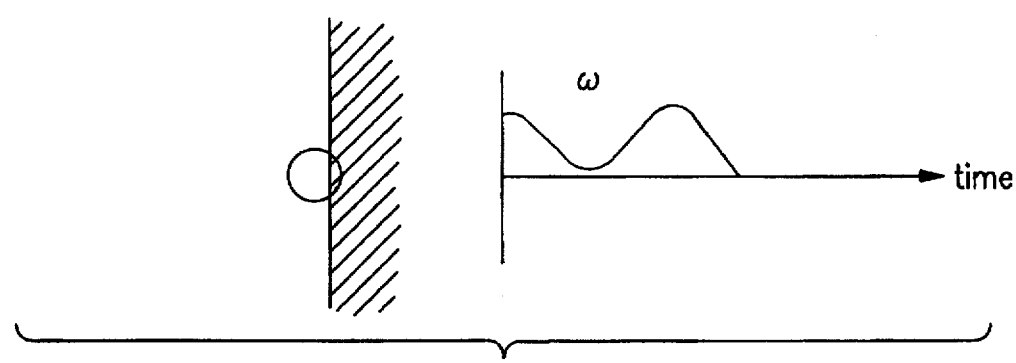
Figure 7D:
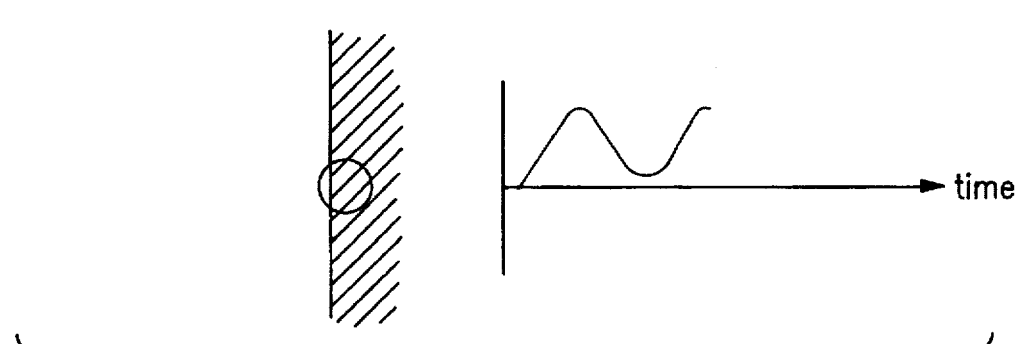

The principles of X-Y positioning are illustrated in FIGS. 7A through 7D. In each case, there is shown the median position of a spot of focused (laser) light which is being dithered left and right (X-direction) at a frequency ω. If, as shown in FIG. 7A, the spot does not ever cross the boundary between a reflective area (on the left) and a non-reflective area (on the right), the output level is relatively constant (except for the pits in the non-reflective area which are compensated for by the above-described averaging). If, as shown in FIGS. 7C and 7D, the median position of the focused spot is as shown, the resulting output waveform changes as seen in the right-hand portions of FIGS. 7C and 7D, respectively. Thus, as with Z-direction positioning, dithering can also be used to discriminate between desirable (FIG. 7B) tracking and the need to move the spot. Also, as above with respect to Z-direction positioning, the present invention also provides a particular value, R, indicative of the amount by which the median spot position is to be moved and the direction in which it must be moved, that is, to the right in FIG. 7C and to the left in FIG. 7D.

Yet another application of the present invention is found in the reading of stored (typically digital) information on an optical disk when the disk contains both audio and video and/or audio and digital data. In particular, CD-ROMs for computer use and optical disks described as Digital Video Disks (DVDs) store information in different formats. Moreover, an optical disk could store audio information in one layer and digital data on another layer. The laser spot size used for reading these two different formats (audio and data) is also different. However, the present invention is capable of controlling both the plane of focus and the laser spot size. Even if these different formats are present on a single-layer optical disk, the disk is still fully readable by the methods and systems of the present invention.

It should also be appreciated that, while the example discussions herein have been directed to the utilization of a single read head, the present invention is nonetheless fully employable in situations and devices which use an array of read heads (or other readout devices) to achieve the readout of data in parallel. In fact, the smaller sizes, made practical by the present invention, provide greater room for additional read heads for parallel operations.

From the above, it should be appreciated that all of the above-mentioned objectives have been achieved. Furthermore, it is seen that the apparatus of the present invention provides a mechanism for precisely aligning the focal point of a laser light source within a multilayer optical storage disk device. Because the present invention can take advantage of waist-coil-activated mechanisms already in place for positioning optical storage disk lens systems, the system of the present invention may be retrofitted to existing CD-ROM devices with minimal inconvenience. However, it is to be particularly noted that the operation of the present invention is not limited to oscillatory movement of the lens. The light source or the target may also be moved. What matters is the relative motion of one component in the system (light source, lens, reflective target) with respect to the other two components. Motion of the target itself, though, is not desirable in the typical CD-ROM system employing the present invention.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A combined laser source and detector system comprising:

a semiconductor laser light source which is capable of having its light output modulated by varying drive current applied to said semiconductor light source;

means for varying the focus of light from said source, in an oscillatory manner, at a selected frequency; and means for detecting, in the range of said selected frequency, variations in current flowing through said semiconductor source, said variations being induced by laser light which is emitted from and is subsequently returned to said semiconductor light source.

2. The system of claim 1 wherein said means for detection comprises a resistive means through which said current passes and a frequency filter means which is coupled to voltage signals appearing across said resistive means and which is capable of selectively passing signals in the same frequency range as said variations.

3. The system of claim 1 further including reflective target means which is positioned to return light from said source back to said source.

4. The system of claim 3 in which said reflective target is rotating.

5. The system of claim 3 in which said target is a compact disk.

* * * * *